United States Patent [19]

Blanchard et al.

[11] Patent Number: 4,799,100

[45] Date of Patent: Jan. 17, 1989

[54] METHOD AND APPARATUS FOR INCREASING BREAKDOWN OF A PLANAR JUNCTION

[75] Inventors: Richard A. Blanchard, Los Altos; Adrian I. Cogan, San Jose, both of Calif.

[73] Assignee: Siliconix Incorporated, Santa Clara, Calif.

[21] Appl. No.: 14,961

[22] Filed: Feb. 17, 1987

[51] Int. Cl.[4] .................. H01L 29/12; H01L 29/40
[52] U.S. Cl. ............................ 357/52; 357/53; 357/91
[58] Field of Search .................... 357/52, 53, 9.1

[56] References Cited

U.S. PATENT DOCUMENTS

| 4,090,213 | 5/1978 | Maserjian et al. | 357/52 |
|---|---|---|---|
| 4,481,527 | 11/1984 | Chen et al. | 357/52 |
| 4,544,416 | 10/1985 | Meador et al. | 357/52 |
| 4,551,353 | 11/1985 | Hower et al. | 357/52 |

FOREIGN PATENT DOCUMENTS

| 2425942 | 1/1975 | Fed. Rep. of Germany | 357/52 |
|---|---|---|---|
| 50-40636 | 12/1975 | Japan | 357/52 |
| 58-91641 | 5/1983 | Japan | 357/52 |
| 58-111322 | 7/1983 | Japan | 357/52 |

OTHER PUBLICATIONS

"Physics of Semiconductor Devices", 2nd Edition, by S. M. Sze, (1981), pp. 73, 106–108.

"Surface Breakdown in Silicon Planar Diodes Equipped with Field Plate", by Conti & Conti, published in Solid-State Electronics, 1982, vol. 15, pp. 93–105.

"Locking Capability of Planar Devices with Field Limiting Rings", by Brieger, Gerlach, and Pelka, published in Solid-State Electronics, vol. 26, No. 8, pp. 739–745 (1983).

Primary Examiner—Andrew J. James
Assistant Examiner—Jerome Jackson
Attorney, Agent, or Firm—Alan H. MacPherson; Paul J. Winters; Norman R. Klivans

[57] ABSTRACT

In order to increase breakdown voltage of a planar junction of a semiconductor device, an oxide layer is provided on a portion of the surface of the semiconductor substrate and covers the junction at that surface, the oxide layer containing a charged ion region extending from the junction over a portion of the substrate, with the polarity of the ions being the same as the polarity of the substrate region over which the oxide layer extends.

23 Claims, 2 Drawing Sheets

METHOD AND APPARATUS FOR INCREASING BREAKDOWN OF A PLANAR JUNCTION

BACKGROUND OF THE INVENTION

This invention relates to semiconductor devices, and more particularly, to a semiconductor device including a planar junction subject to avalanche breakdown upon a high reverse bias voltage applied thereto.

In a semiconductor device of the type including a planar junction which extends to the surface of the device substrate, it is desirable in many environments to provide a high breakdown voltage of the junction (i.e., the level of reverse bias voltage which results in avalanche breakdown).

A number of approaches have been developed in an attempt to accomplish that goal. In discussing those approaches, reference is made to FIGS. 1–4 showing typical prior art techniques.

Referring to FIG. 1, a typical device 10 of this type is shown, having a substrate 12 including a first region 14 of first (for example P) conductivity type, and a second region 16 of second (for example N) conductivity type. Upon application of a certain level of reverse bias voltage to the device 10, avalanche breakdown will occur. As is well known, the radius of curvature r of the PN junction 18 is very important in determining the breakdown voltage of the device 10. As pointed out in "Physics of Semiconductor Devices", 2nd Edition, authored by S.M. Sze, (1981) at pages 73 and 106–108, the cylindrical and/or spherical regions of the junction 18 have a higher field intensity, so that the level of reverse bias resulting in avalanche breakdown is determined by the radius of curvature of those regions 20. As the radius of curvature of such a cylindrical and/or spherical region 20 is decreased, the breakdown voltage of the device decreases.

In order to increase the radius r, deep diffused junctions 22 (FIG. 2) have been undertaken. While this method has proven effective in increasing the radius r and in turn the breakdown voltage of the device, such an approach requires a long diffusion time and consumes valuable wafer space.

Another well known approach (FIG. 3) for increasing device breakdown voltage is to include a field plate 24 as an extension of contact 26 on region 16b. The field plate 24 extends beyond the junction 28b at the surface 30 of the substrate 12b and over a portion 32 of the substrate 12b, spaced from the portion 32 of the substrate 12b by an oxide layer 34. This has the effect of increasing the dimension of the depletion region along the surface 30 of the substrate 12b when reverse bias voltage is applied to field plate 24 relative to substrate 12b (see dotted line 36 and dimension 38) which in turn increases the breakdown voltage of the device. This approach is described in "Surface Breakdown in Silicon Planar Diodes Equipped with Field Plate", by Conti & Conti, published in Solid-State Electronics, 1972, Volume 15 pages 93–105. While such a method has proven effective in increasing the breakdown voltage of the device, again, similar to the previous method, a large amount of area is taken up, and also, such a method is applicable only over a certain range of resistivities and oxide thicknesses, as field induced breakdown may occur.

Yet another approach for increasing breakdown voltage of such a device is shown in FIG. 4. That approach includes provision of field limiting rings 40 of a conductivity type the same as that of the region 16c. Provision of such rings 40 results in a depletion region which is indicated by the dotted line 42 when reverse bias voltage is applied. Thus, the dimension 44 of the depletion region 42 along the surface 48 of the substrate 12c is increased, in turn resulting in a higher breakdown voltage. This phenomenon is described in "Blocking Capability of Planar Devices with Field Limiting Rings", by Brieger, Gerlach, and Pelka, published in Solid-State Electronics, Volume 26, Number 8, pages 739–745 (1983).

While this system also has proven effective in increasing breakdown voltage, it too has the problem of using up a large surface area.

SUMMARY OF THE INVENTION

It is accordingly an object of this invention to provide method and apparatus for increasing the breakdown voltage of a planar junction of a semiconductor device, which is effective in practice and use, meanwhile ensuring efficient layout of semiconductor wafer area.

Broadly stated, the semiconductor device includes a substrate having a region of first conductivity type and a region of second type conductivity type, together forming a junction which extends to the surface of the substrate, an oxide layer on a portion of the surface of the substrate and covering the junction at the surface, and a charged ion region in the oxide layer extending generally from adjacent to the junction at the surface of the substrate over a portion of the region of first conductivity type, the polarity of the ions in the ion region being the same as the polarity of the region of the first conductivity type.

Broadly stated, the method of forming a semiconductor device consists of providing a semiconductor substrate having a region of first conductivity type and a region of second conductivity type, the regions forming a junction extending to the surfaces of the substrate, providing an oxide layer over a portion of the substrate, covering the junction at the surface of the substrate, and providing charged ions in the oxide layer, extending from adjacent to the junction, over a portion of the region of first conductivity type of the substrate, the charged ions being of the same polarity as the region of the first conductivity type.

The present invention overcomes the above-cited problems by utilizing charged ions in an oxide layer which covers a portion of the substrate, and also covers the junction at the surface of the substrate. The charged ions are arranged so that they extend from generally over that junction at the substrate to over a portion of the substrate itself, the ions being of the same polarity as the conductivity type of that portion of the substrate.

BRIEF DESCRIPTION OF THE DRAWINGS

Other objects of the invention will become apparent from a study of the following specification and drawings, in which.

DESCRIPTION OF THE PREFERRED EMBODIMENTS

Figure 5:
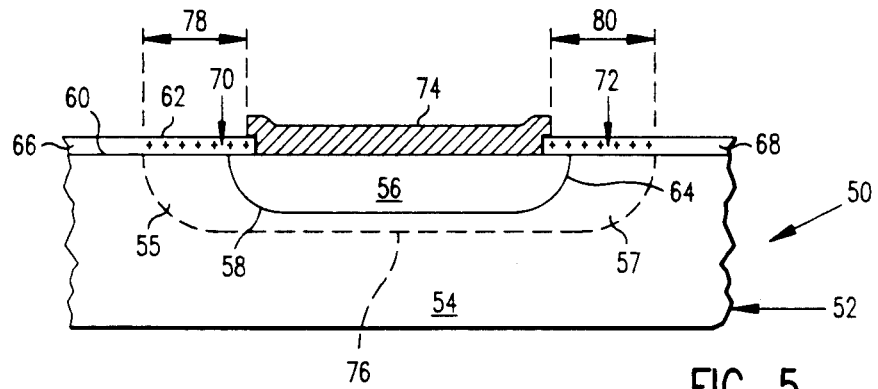
FIG. 5 shows a device in cross section showing a first embodiment of the invention.

Referring to FIG. 5, a semiconductor device 50 is shown in cross-section. Such device 50 includes a substrate 52 having a region 54 of first conductivity type (in this example, P conductivity type), and a region 56 of second conductivity type (in this example N conductivity type), formed in the substrate 52 by means of, for example, diffusion. These regions 54, 56 together form a junction 58 which extends to the substantially flat surface 60 of the substrate 52 at 62 and 64. Oxide layer portions 66, 68 are shown on the surface 60 of the substrate 52. The oxide layer portion 66 covers the junction portion 62 adjacent surface 60, while the oxide layer portion 68 covers the junction portion 64 adjacent surface 60. In fact, these oxide layer portions 66,68 are used as a mask during the diffusion forming the region 56.

Charged ions 70, 72 are implanted into the oxide layer portions 66, 68 as shown. These charged ions 70, 72 are implanted at a certain energy level, so that they generally adopt the positions shown in FIG. 5, with the ions 70 extending from generally over and adjacent to the junction portion 62 at the surface 60 of the substrate 52, over a portion 55 of the region 54, while the ions 72 extend from generally over and adjacent to the junction 64 portion at the surface 60 of the substrate 52, over a portion 57 of the region 54. Because the charged ions 70, 72 are all implanted at a certain energy level they are all positioned roughly the same distance from the surface 60 of the substrate 52. These charged ions 70, 72 are of the same polarity as the polarity of the region 54, and in this particular embodiment are cesium ions.

A contact element 74 is subsequently formed by masking 17 and application of metal as is well known, to contact the region 56.

Figure 3:
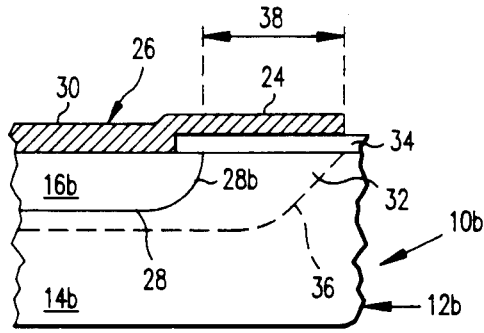
Figure 4:
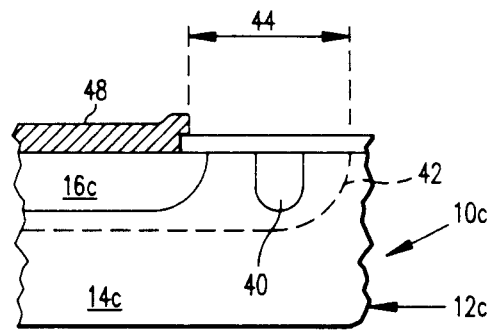

Through the use of the implanted ions 70, 72 the depletion region will take the form shown by dotted line 76 in FIG. 5 when reverse bias is applied, similar to that shown in FIG. 3 when a field plate is used. This increased size of the depletion region 76 (particularly dimensions 78 and 80 along surface 60 of substrate 52) in turn results in an increase in the breakdown voltage of the device 50. However, not only does this system result in saving of area compared to the field plate system (because the charged ions 70, 72 can be concentrated highly in the oxide layer portions 66, 68), but also the present technique is applicable over a wide range of resistivities and oxide thicknesses, overcoming another problem inherent in use of field plates.

Figure 1:
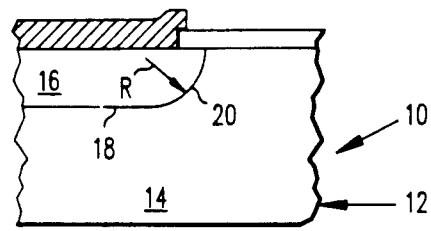
FIGS. 1–4 illustrate prior art devices relating to the present subject matter.
Figure 2:
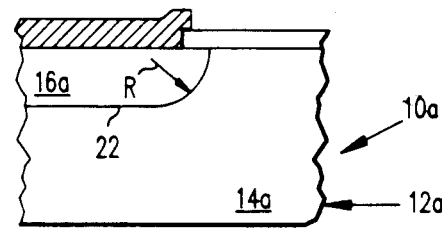
Figure 6:
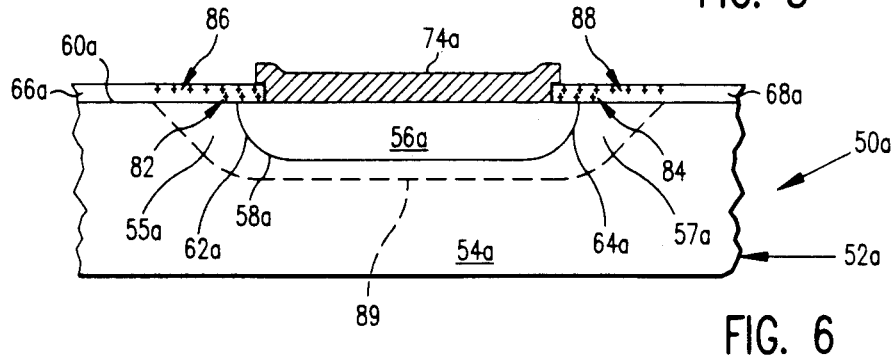
FIG. 6 shows a device in cross section illustrating a second embodiment of the invention.

Referring to FIG. 6, a variation of the present invention is shown. Certain charged ions 82, 84 of the same polarity type as region 54a, are implanted adjacent to the junction portions 62a, 64a, respectively, at a relatively high energy level, so as to be positioned quite close to the surface 60a of the substrate 52a, the ions 82, 84 extending from the junction portions 62a, 64a only a limited distance over the regions 55a, 57a of the substrate 52a. Subsequent to the implantation-to those charged ions 82, 84, further charged ions 86, 88 are implanted at an energy level less than the original energy level, so that the implanted ions 86, 88 are positioned a greater distance from the surface 60a of the substrate 52a than the implanted ions 82, 84, with the second implantation being undertaken so that those implanted ions 86, 88 extend also from generally adjacent the junction portions 62a, 64a to a distance further over the regions 55a, 57a than the-implanted ions 82, 84. Again, this results in a depletion region 89 extending further into the regions 55a, 57a than, for example, the depletion region of the FIG. 1 device.

Figure 7:
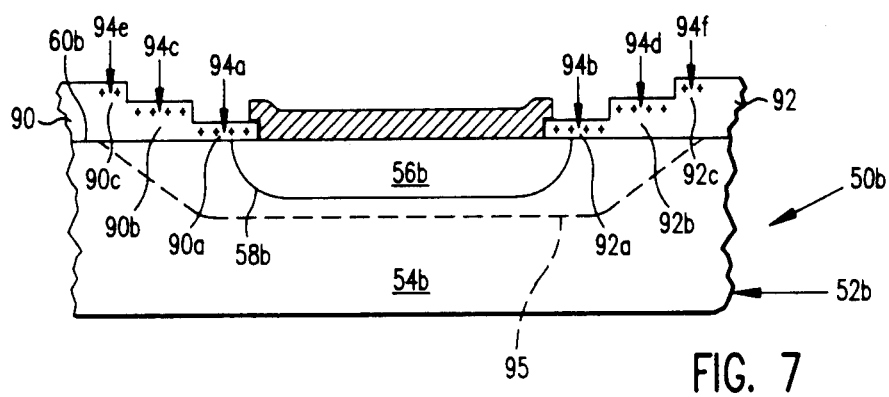
FIG. 7 shows a device in cross section illustrating a third embodiment of the invention.

FIG. 7 shows another variation of the invention, wherein the oxide layer portions 90, 92 on either side of the region 56b are stepped, that is, each oxide layer portion is thinnest at its area 90a, 92a adjacent the junction portions 62b, 64b at the surface 60b with the oxide layer areas 90b, 92b being thicker further from the junction portions 62b, 64b and over the regions 55b, 57b, and even thicker further on at 90c, 92c. Charged ions 94a, 94b, 94c, 94d, 94e, 94f (of the same conductivity type as region 54b) are then implanted, all simultaneously and at a certain energy level, so that they position themselves as shown in FIG. 7. Thus, the charged ions 94a, 94b adjacent to the region 56b are closest to the surface 60b of the substrate 52b, while the charged ions 94c, 94d are somewhat further from the surface of the substrate 52b and the charged ions 94e, 94f are even further from the surface 60b of the substrate 52b. This results in a depletion region as indicated by the dotted line at 95 when reverse bias voltage is applied.

It will thus be seen that through the above-cited techniques, the depletion region of each device can be tailored as chosen to meet the operating parameters needed.

Figure 8:
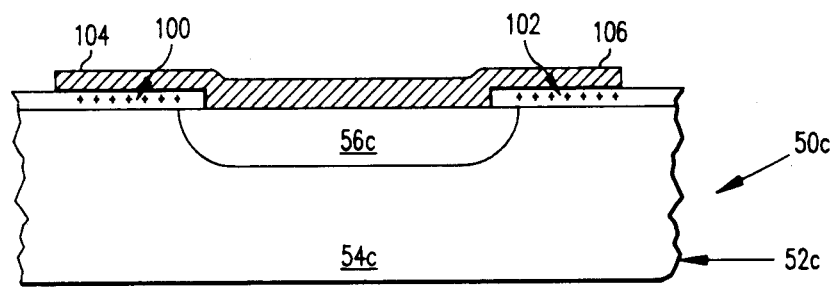
FIG. 8 shows a device in cross section illustrating a fourth embodiment of the invention.
Figure 9:
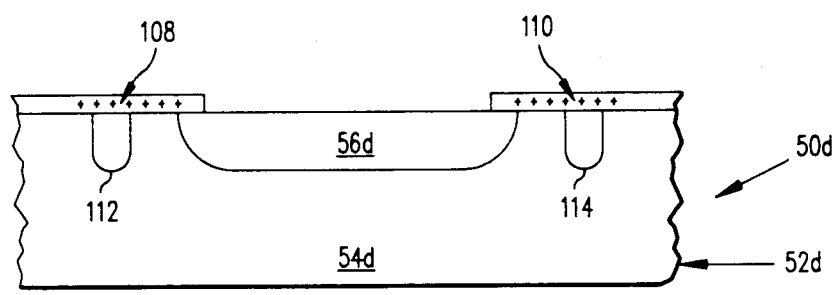
FIG. 9 shows a device in cross section illustrating a fifth embodiment of the invention.

Referring to FIG. 8, the implanting of charged ions at 100, 102 as described above is combined with field plates 104, 106 to define depletion regions which may be tailored to the specific case. This is also the situation in FIG. 9, wherein the implanting of charged ions at 108, 110 as described above is combined with guard rings 112, 114 to define depletion regions which may be specifically configured to meet chosen parameters.

It will therefore be readily seen that herein are provided a simple method and structure for increasing the breakdown voltage of a planar junction of a semiconductor device, meanwhile being efficient in use of wafer area, and being applicable to a variety of needs, including a wide range of resistivities and oxide thicknesses. Furthermore, there is no need for lengthy diffusion time for forming the junction, as was a problem in the prior art.

It will be understood that the conductivity types of all elements as disclosed can be reversed. In such case, where the region 54 of any embodiment is N type and the region 56 of any embodiment is P type, the implanted ions can be be iodine, chlorine, or boron. Furthermore, multiple doses of charged ions can be used so that the concentrations thereof will vary in the oxide layers as chosen. For example, a structure generally similar to that shown in FIG. 6 can be achieved by applying a heavy dose of charged ions in the areas adjacent the junction portions 62a, 64a, with a lighter dose of implanted ions adjacent thereto but extending further therefrom over the regions 55a, 57a.

It is to be understood that the scope of the invention is not to be determined by the above description, but only by the following claims.

We claim:

1. A semiconductor device comprising a substrate having a region of first conductivity type and a region of second conductivity type, together forming a junction which extends to a surface of the substrate;

an oxide layer portion on the surface of the substrate and covering the junction at the surface; and a charged ion region in said oxide layer extending generally from adjacent to the junction at the surface of the substrate over a portion of the region of first conductivity type, the polarity of the ions in said ion region being the same as the polarity of the region of first conductivity type, wherein the charged ion region in said oxide layer is of greater concentration in a first portion thereof than in a second portion thereof.

2. A semiconductor device according to claim 1 wherein the charged ion region in said oxide layer is of greater concentration generally adjacent to the junction at the surface of the substrate than over the portion of the region of first conductivity type.

3. A semiconductor device according to claim 1 wherein the charged ion region is positioned so that the portion thereof generally adjacent to the junction is closer to the surface of the substrate than the portion thereof over the portion of the region of first conductivity type.

4. The semiconductor device of claim 1 wherein the first conductivity type is P conductivity type, the second conductivity type is N conductivity type, and the charged ion region is made up of cesium ions.

5. The semiconductor device of claim 1 wherein the first conductivity type is N conductivity type, the second conductivity type is P conductivity type, and the charged ion region is made up of iodine ions.

6. The semiconductor device of claim 1 wherein the first conductivity type is N conductivity type, the second conductivity type is P conductivity type, and the charged ion region is made up of chlorine ions.

7. The semiconductor device of claim 1 wherein the first conductivity type is N conductivity type, the second conductivity type is P conductivity type, and the charged ion region is made up of boron ions.

8. The semiconductor device of claim 1, further comprising at least one guard ring of the first conductivity type formed in the substrate and surrounding the region of the first conductivity type at the surface of the substrate.

9. The semiconductor device of claim 1, further comprising a conductive field plate overlying the region of the first conductivity type and at least a portion of the region of the second conductivity type.

10. A semiconductor device comprising a substrate having a region of first conductivity type and a region of second conductivity type, together forming a junction which extends to a surface of the substrate;

an oxide layer portion on the surface of the substrate and covering the junction at the surface: and a charged ion region in said oxide layer extending generally from adjacent to the junction at the surface of the substrate over a portion of the region of first conductivity type, the polarity of the ions in said ion region being the same as the polarity of the region of first conductivity type, wherein the charged ion region is positioned so that the portion thereof generally adjacent to the junction is closer to the surface of the substrate than the portion thereof over the portion of the region of first conductivity type.

11. The semiconductor device of claim 10 wherein the first conductivity type is P conductivity type, the second conductivity type is N conductivity type, and the charged ion region is made up of cesium ions.

12. The semiconductor device of claim 10 wherein the first conductivity type is N conductivity type, the second conductivity type is P conductivity type, and the charged ion region is made up of iodine ions.

13. The semiconductor device of claim 10 wherein the first conductivity type is N conductivity type, the second conductivity type is P conductivity type, and the charged ion region is made up of chlorine ions.

14. The semiconductor device of claim 10 wherein the first conductivity type is N conductivity type, the second conductivity type is P conductivity type, and the charged ion region is made up of boron ions.

15. The semiconductor device of claim 10, further comprising at least one guard ring of the first conductivity type formed in the substrate and surrounding the region of the first conductivity type at the surface of the substrate.

16. The semiconductor device of claim 10, further comprising a conductive field plate overlying the region of the first conductivity type and at least a portion of the region of the second conductivity type.

17. A semiconductor device comprising a substrate having a region of first conductivity type and a region of second conductivity type, together forming a junction which extends to a surface of the substrate;

an oxide layer portion on the surface of the substrate and covering the junction at the surface: and a charged ion region in said oxide layer extending generally from adjacent to the junction at the surface of the substrate over a portion of the region of first conductivity type, the polarity of the ions in said ion region being the same as the polarity of the region of first conductivity type, wherein the charged ion region in said oxide layer is of greater concentration general adjacent to the junction at the surface of the substrate than over the portion of the region of first conductivity type.

18. The semiconductor device of claim 17 wherein the first conductivity type is P conductivity type, the second conductivity type is N conductivity type, and the charged ion region is made up of cesium ions.

19. The semiconductor device of claim 17 wherein the first conductivity type is N conductivity type, the second conductivity type is P conductivity type, and the charged ion region is made up of iodine ions.

20. The semiconductor device of claim 17 wherein the first conductivity type is N conductivity type, the second conductivity type is P conductivity type, and the charged ion region is made up of chlorine ions.

21. The semiconductor device of claim 17 wherein the first conductivity type is N conductivity type, the second conductivity type is P conductivity type, and the charged ion region is made up of boron ions.

22. The semiconductor device of claim 17, further comprising at least one guard ring of the first conductivity type formed in the substrate and surrounding the region of the first conductivity type at the surface of the substrate.

23. The semiconductor device of claim 17, further comprising a conductive field plate overlying the region of the first conductivity type and at least a portion of the region of the second conductivity type.

* * * * *

UNITED STATES PATENT AND TRADEMARK OFFICE

Certificate

Patent No. 4,799,100

Patented: Jan. 17, 1989

On petition requesting issuance of a certificate of correction of inventorship pursuant to 35 UCS 256, it has been found that the above-identified patent, through error and without any deceptive intent, improperly sets forth the inventorship. Accordingly, it is hereby certified that the correct inventorship of this patent is:

Richard K. Williams, Cupertino, Calif.; Richard A. Blanchard, Los Altos, Calif.; Adrian I. Cogan, San Jose, Calif.

Signed and Sealed this 7th Day of November 1989

Andrew J. James

*Supervisory Patent Examiner*
*Group Art Unit 253*